United States Patent
Mahmoudidaryan et al.

(10) Patent No.: US 11,621,716 B1
(45) Date of Patent: Apr. 4, 2023

(54) RETURN-TO-ZERO (RZ) DIGITAL-TO-ANALOG CONVERTER (DAC) FOR IMAGE CANCELLATION

(71) Applicant: QUALCOMM Incorporated, San Diego, CA (US)

(72) Inventors: Parisa Mahmoudidaryan, San Diego, CA (US); Nitz Saputra, Burlingame, CA (US); Dongwon Seo, San Diego, CA (US); Shahin Mehdizad Taleie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/448,461

(22) Filed: Sep. 22, 2021

(51) Int. Cl.
H03M 1/66 (2006.01)
H03M 1/06 (2006.01)

(52) U.S. Cl.
CPC .................. *H03M 1/0626* (2013.01)

(58) Field of Classification Search
CPC ...... H03M 1/662; H03M 1/66; H03M 1/0863; H03M 1/74; H03M 3/464; H03M 3/502; H03M 1/742; H03M 1/002; H03M 1/0607; H03M 1/0624; H03M 1/0629; H03M 1/0665; H03M 1/0678; H03M 1/0836; H03M 1/1009; H03M 1/128; H03M 1/747; H03M 1/0614; H03M 1/0673; H03M 1/0675; H03M 1/1023
USPC .......................................... 341/139–141, 144
See application file for complete search history.

(56) References Cited

U.S. PATENT DOCUMENTS

| | | | | | |
|---|---|---|---|---|---|
| 5,521,946 | A | * | 5/1996 | Main ................... | H03H 17/0657 375/373 |
| 5,590,155 | A | * | 12/1996 | Yasuda ............... | H04L 27/2092 375/281 |
| 6,476,748 | B1 | * | 11/2002 | Galton ................ | H03M 1/0675 341/68 |
| 6,825,785 | B1 | * | 11/2004 | Huang .................... | H03L 7/093 341/144 |
| 6,977,602 | B1 | * | 12/2005 | Ostrem ............... | H03M 1/0863 341/145 |
| 8,502,720 | B1 | * | 8/2013 | Wyville .............. | H03M 1/0629 341/149 |
| 9,413,394 | B1 | * | 8/2016 | Lye ....................... | H04B 1/0014 |

(Continued)

OTHER PUBLICATIONS

Balasubramanian S., et al., "Systematic Analysis of Interleaved Digital-to-Analog Converters", IEEE Transactions an Circuits and Systems II: Express Briefs, IEEE, USA, vol. 58, No. 12, Dec. 1, 2011, pp. 882-886, XP011391154, ISSN: 1549-7747, Section II, Section III.E, figures 1-3.

(Continued)

*Primary Examiner* — Linh V Nguyen
(74) *Attorney, Agent, or Firm* — Patterson & Sheridan, LLP

(57) ABSTRACT

Certain aspects of the present disclosure generally relate to circuitry and techniques for digital-to-analog conversion. One example device for digital-to-analog conversion generally includes: a digital-to-analog converter (DAC) having an input coupled to an input node of the device; a first return-to-zero (RZ) DAC having an input coupled to an input node of the device; and a combiner, wherein an output of the first DAC is coupled to a first input of the combiner, and wherein an output of the first RZ DAC is coupled to a second input of the combiner.

30 Claims, 10 Drawing Sheets

(56) References Cited

U.S. PATENT DOCUMENTS

| | | | |
|---|---|---|---|
| 9,954,547 B1* | 4/2018 | Azenkot | H03K 5/135 |
| 9,973,203 B1* | 5/2018 | Azenkot | H03M 1/662 |
| 2020/0169266 A1 | 5/2020 | Mehdizad Taleie et al. | |
| 2020/0266842 A1* | 8/2020 | Patel | H04B 1/04 |

OTHER PUBLICATIONS

Deng R., et al., "Increasing Data Rate of an Optical IMDD System Using a Cost-Efficient Dual-Band Transmission Scheme Based on RTZ DAC and Sub-Nyquist Sampling ADC", Optics Express, vol. 26, No. 9, Apr. 20, 2018, pp. 11599-11607, XP093006363, Section 2, figure 1.

International Search Report and Written Opinion—PCT/US2022/075860—ISA/EPO—dated Jan. 2, 2023.

Li X., et al., "A 14 Bit 500 MS/s CMOS DAC Using Complementary Switched Current Sources and Time-Relaxed Interleaving DRRZ", IEEE Transactions on Circuits and Systems I: Regular Papers, IEEE, US, vol. 61, No. 8, Aug. 1, 2014, pp. 2337-2347, XP011554630, ISSN: 1549-8328, figure 9.5.2.

Park M., et al., "A 0.13µm CMOS 78dB SNDR 87mW 20MHz BW CT [Delta] [Sigma] ADC with VCO-Based Integrator and Quantizer", Solid-State Circuits Conference—Digest of Technical Papers, 2009. ISSCC 2009. IEEE International, IEEE, Piscataway, NJ, USA, Feb. 8, 2009, p. 170, pp. 170-173, XP031742214, ISBN 978-1-4244-3458-9, Section III, figure 11.

\* cited by examiner

RETURN-TO-ZERO (RZ) DIGITAL-TO-ANALOG CONVERTER (DAC) FOR IMAGE CANCELLATION

TECHNICAL FIELD

Certain aspects of the present disclosure generally relate to electronic circuits and, more particularly, to circuitry for digital-to-analog conversion.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more digital-to-analog converters (DACs) for converting digital signals to analog signals.

SUMMARY

The systems, methods, and devices of the disclosure each have several aspects, no single one of which is solely responsible for its desirable attributes. Without limiting the scope of this disclosure as expressed by the claims that follow, some features are discussed briefly below. After considering this discussion, and particularly after reading the section entitled "Detailed Description," one will understand how the features of this disclosure provide the advantages described herein.

Certain aspects of the present disclosure generally relate to circuitry and techniques for digital-to-analog conversion.

Certain aspects are directed to a device for digital-to-analog conversion. The device generally includes a digital-to-analog converter (DAC) having an input coupled to an input node of the device, a first return-to-zero (RZ) DAC having an input coupled to an input node of the device, and a combiner, wherein an output of the DAC is coupled to a first input of the combiner, and wherein an output of the first RZ DAC is coupled to a second input of the combiner.

Certain aspects are directed to a method for digital-to-analog conversion. The method generally includes generating, via a DAC, a first analog signal by performing digital-to-analog conversion based on a digital input signal, generating, via a first RZ DAC, a second analog signal by performing digital-to-analog conversion based on the digital input signal, and combining the first analog signal and the second analog signal to generate a combined analog signal.

Certain aspects are directed to an apparatus for digital-to-analog conversion. The apparatus generally includes a DAC configured to generate a first analog signal by performing digital-to-analog conversion based on a digital input signal, a first RZ DAC configured to generate a second analog signal by performing digital-to-analog conversion based on the digital input signal, and a combiner configured to combine the first analog signal and the second analog signal to generate a combined analog signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
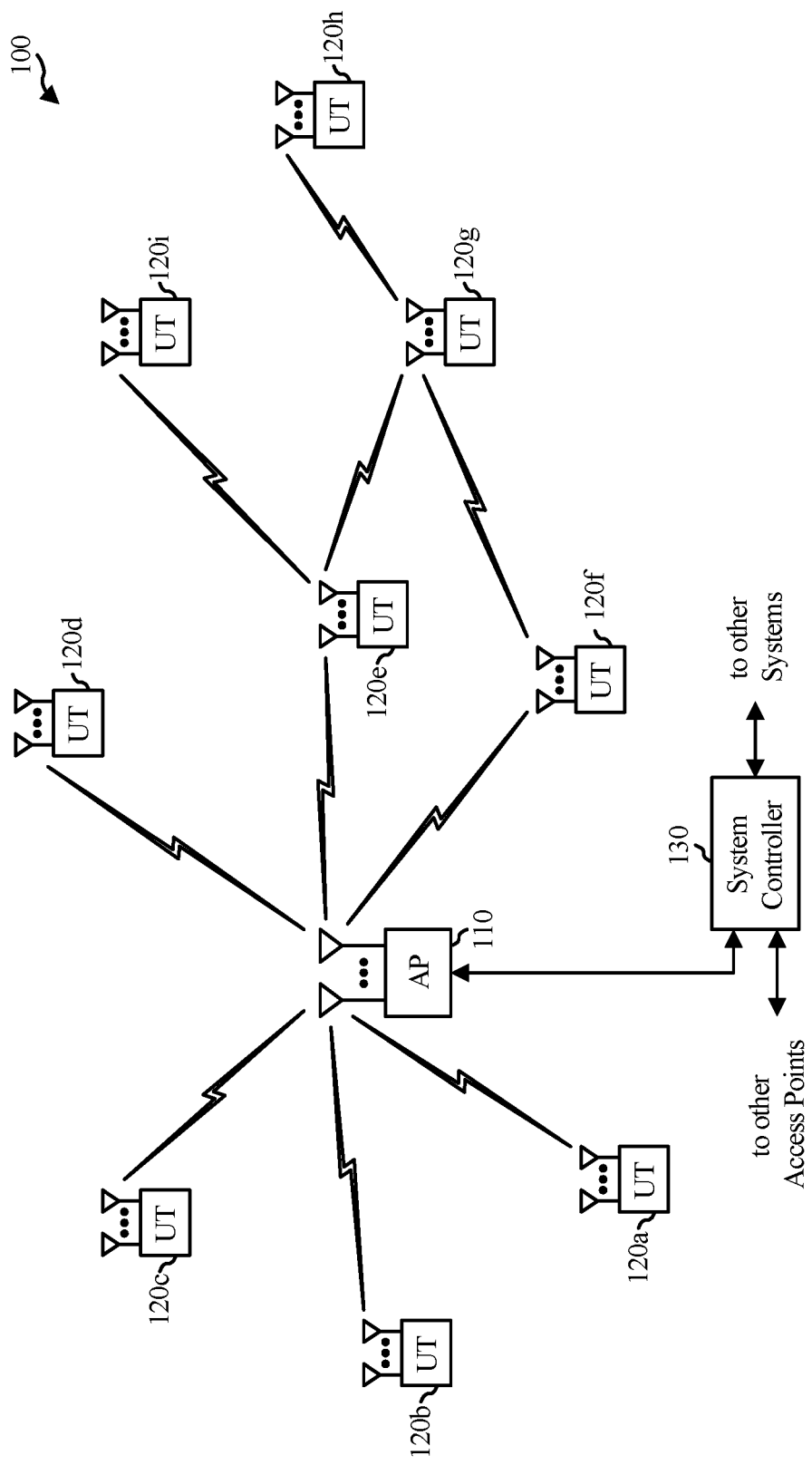
FIG. 1 is a diagram of an example wireless communications network, in accordance with certain aspects of the present disclosure.

Certain aspects of the present disclosure generally relate to electronic circuits and, more particularly, to circuitry for digital-to-analog conversion. In some aspects, an analog signal generated by a digital-to-analog converter (DAC) (e.g., a zero-order hold DAC) may be combined with one or more output signals generated by one or more return-to-zero (RZ) DACs. The RZ DACs serve to cancel (or at least reduce) image signals at the output of a DAC system including the zero-order hold DAC and the one or more RZ DACs. As a result of sampling taking place in the zero-order hold DAC, the analog signal generated by the zero-order hold DAC may be different than an ideal analog signal value representing a digital input to the DAC system. This difference (e.g., error) may result in image signals being generated at the output of the DAC system. As described, the analog signal generated by an RZ DAC may be combined with the analog signal generated by the zero-order hold DAC, such that there is a smaller difference between the combined analog output signal and the ideal analog signal value, as compared to the difference between the zero-order hold DAC analog output signal and the ideal analog signal value. Therefore, the image signals at the output of the DAC system may be reduced, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a digital-to-analog converter (DAC) system implemented using one or more return-to-zero (RZ) DACs for image cancellation, as described in more detail herein.

Figure 2:
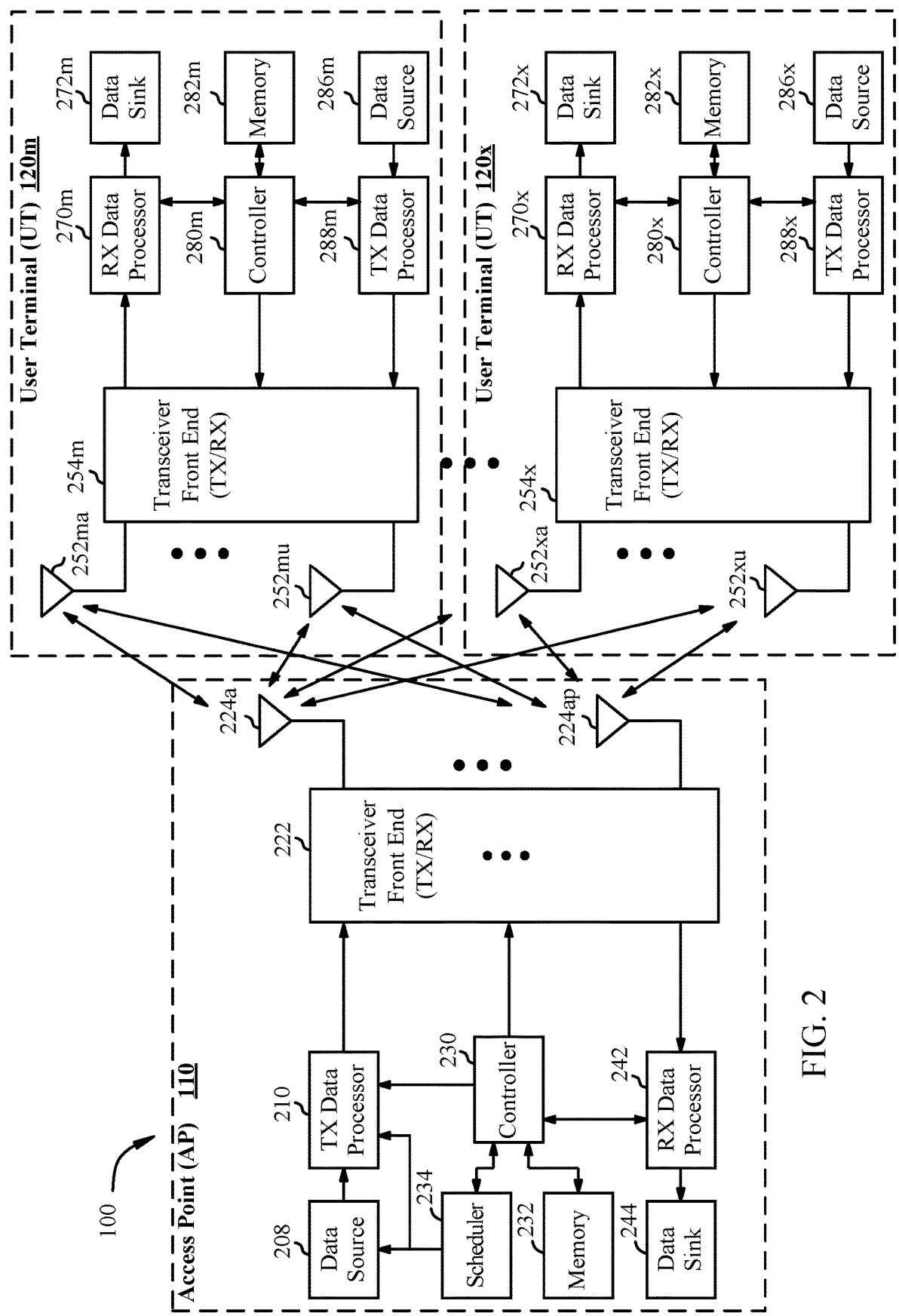
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a DAC system implemented using one or more return-to-zero (RZ) DACs for image cancellation, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
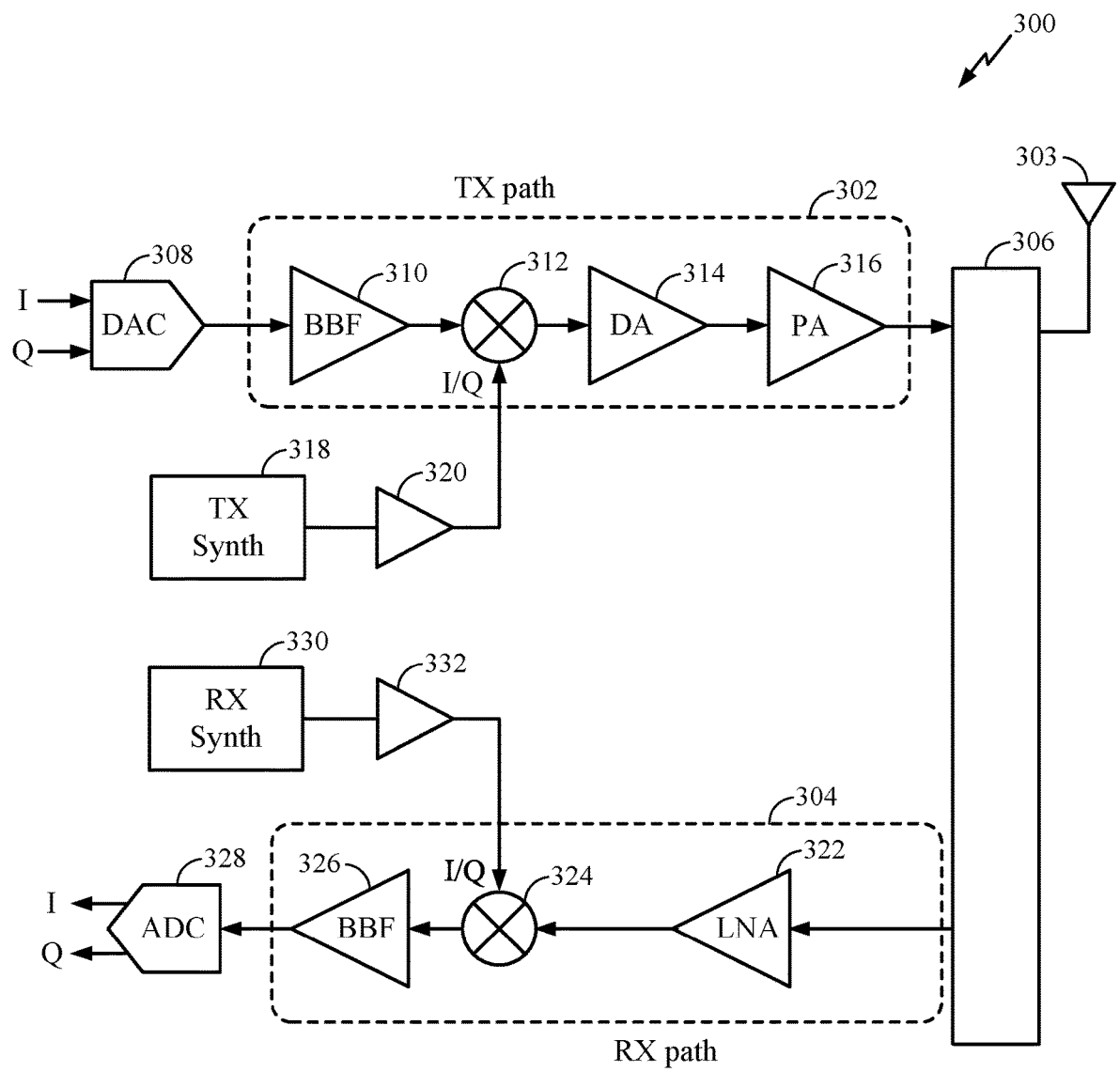
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The DAC 308 may be implemented using one or more return-to-zero (RZ) DACs for image cancellation, as described in more detail herein. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Tuning the LO to different frequencies typically entails using a variable-frequency oscillator, which may involve compromises between stability and tunability. Some systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for digital-to-analog conversion in any of various other suitable systems.

Example Digital-to-Analog Converter (DAC)

The digital-to-analog converter (DAC) (e.g., DAC 308) used in wireless applications creates image signals around multiple harmonics of the sampling frequency (fs) of the DAC. Wireless communication standards may set tight limits on power emissions, and thus, it may be desirable to attenuate image signals in an effort to reduce emitted power at out-of-band frequencies.

One way to reduce/attenuate the power of the image signals is to increase the DAC effective sampling rate (e.g., by using interpolating DACs). However, this approach may result in increased DAC power consumption. In wideband applications, a wideband baseband signal and technology limited sampling frequency (fs) results in a low delta between the frequency of the image and signal, making it challenging to filter out the image signal. Therefore, what is needed are apparatus and techniques for removing, or at least reducing the power of, image signals of a DAC in a power efficient manner.

Certain aspects of the present disclosure use one or more return-to-zero (RZ) DACs in parallel with a zero-order hold DAC to cancel image signals associated with the zero-order hold DAC. An RZ DAC generally refers to a DAC having an analog output representing a digital input signal during only a portion of a cycle of a clock provided to the RZ DAC. For example, an RZ DAC receiving a 50% duty cycle (DC) clock may provide an analog output for half the clock cycle and a zero volt output during the other half of the clock cycle. Similarly, an RZ DAC receiving a 25% duty cycle clock may provide an analog output for 25% of the clock cycle and a zero volt output during the other 75% of the clock cycle. In contrast, a zero-order hold DAC typically samples a digital input at the beginning of a clock cycle and generates an analog output held until the next clock cycle.

Figure 4:
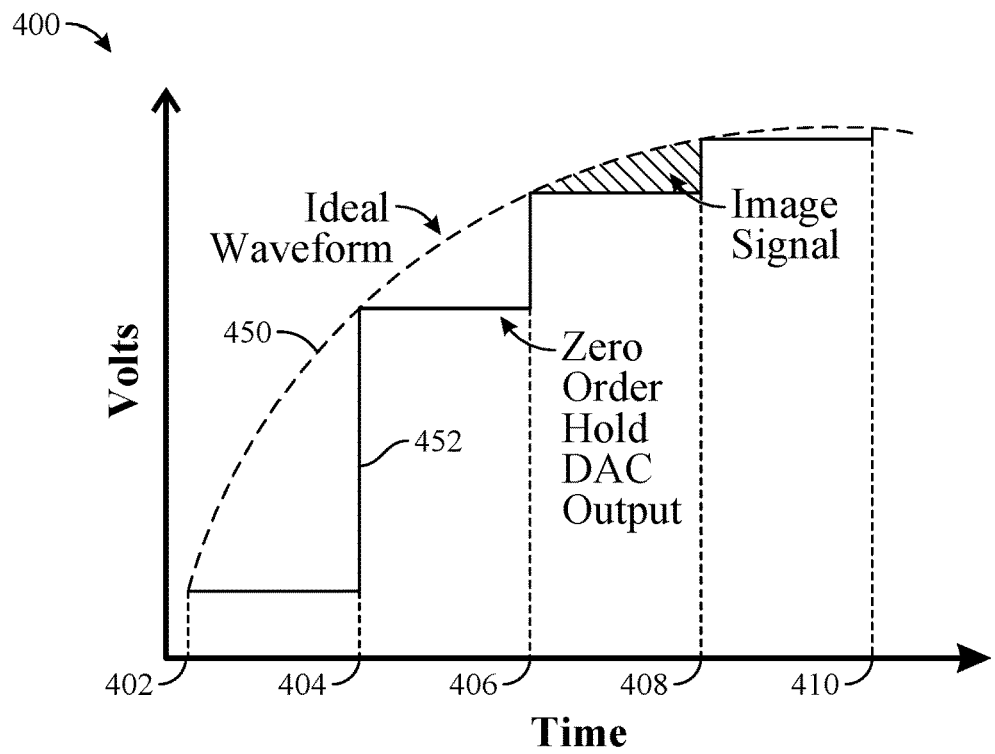
FIG. 4 is a graph illustrating an analog output of a zero-order hold digital-to-analog converter (DAC).

FIG. 4 is a graph 400 illustrating an analog output 452 of a DAC (e.g., zero-order hold DAC) over time. The ideal waveform 450 represents a perfect representation of a digital input to the zero-order hold DAC. As shown, the analog output 452 of the main DAC does not track the ideal waveform, resulting in image signals as described. For example, at times 402, 404, 406, 408, 410 (e.g., representing the beginning of respective clock cycles at the sampling frequency (fs)), the zero-order hold DAC samples a digital input and provides an associated analog output. Thus, at times 402, 404, 406, 408, 410, the analog output may be about the same as the ideal waveform. However, between times 402, 404, 406, 408, 410, the analog output is held at a constant voltage and is different than the ideal waveform, causing the image signals. In some aspects of the present disclosure, a DAC system is implemented with a zero-order hold DAC and one or more RZ DACs to generate an analog output that more closely tracks the ideal waveform, in effect reducing the power of the image signals.

Figure 5:
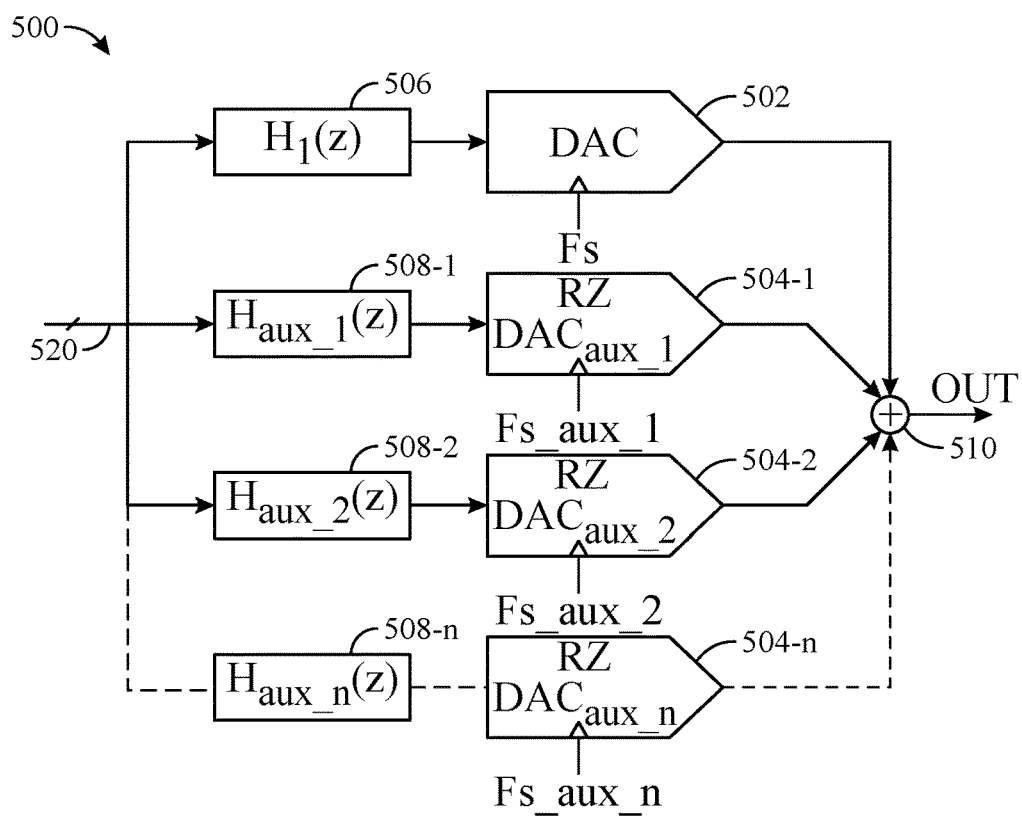
FIG. 5 illustrates a DAC system including a zero-order hold DAC and one or more return-to-zero (RZ) DACs, in accordance with certain aspects of the present disclosure.

FIG. 5 illustrates a digital-to-analog conversion system 500 including a zero-order hold DAC and one or more RZ DACs (e.g., auxiliary DACs), in accordance with certain aspects of the present disclosure. For example, the digital-to-analog conversion system 500 may include a zero-order hold DAC 502 and RZ DACs 504-1 to 504-n, n being an integer greater than 1. The RZ DACs 504-1 to 504-n (labeled "RZ $DAC_{aux\_1}$" to "RZ $DAC_{aux\_n}$") are collectively referred to herein as "RZ DACs 504." While FIG. 5 illustrates three RZ DACs to facilitate understanding, the aspects described herein may be implemented with any number of RZ DACs. As shown, the output of the zero-order hold DAC 502 and the RZ DACs 504 are combined using a combiner 510 to generate an analog output of the digital-to-analog conversion system 500.

As shown, the DAC 502 may receive a clock signal, the frequency of the clock signal setting the sampling frequency (fs) of the DAC 502. The clock signal is labeled "fs" in FIG. 5. Similarly, the RZ DACs 504 receive respective clock signals labeled "Fs_aux_1" to "Fs_aux_n" in FIG. 5, each clock signal setting a sampling frequency of a respective one of the RZ DACs 504.

A digital filter circuit 506 ($H_1(z)$) may be coupled to the input of the DAC 502, and digital filter circuits 508-1 to 508-n (labeled "$H_{aux\_1}(z)$" to "$H_{aux\_n}(z)$") may be coupled to respective inputs of the RZ DACs 504. Digital filter circuits 508-1 to 508-n are collectively referred to as "digital filter circuits 508", n being an integer greater than 1. For example, there may be three digital filter circuits 508-1, 508-2, and 508-3 in some aspects. Each of the digital filter circuits 506, 508 may receive a digital signal at a digital input 520, and provide a filtered version of the digital signal to a respective one of the DACs 502, 504. The digital filter circuits 506, 508 may be implemented as finite impulse response (FIR) filters (e.g., interpolators).

Figure 6A:
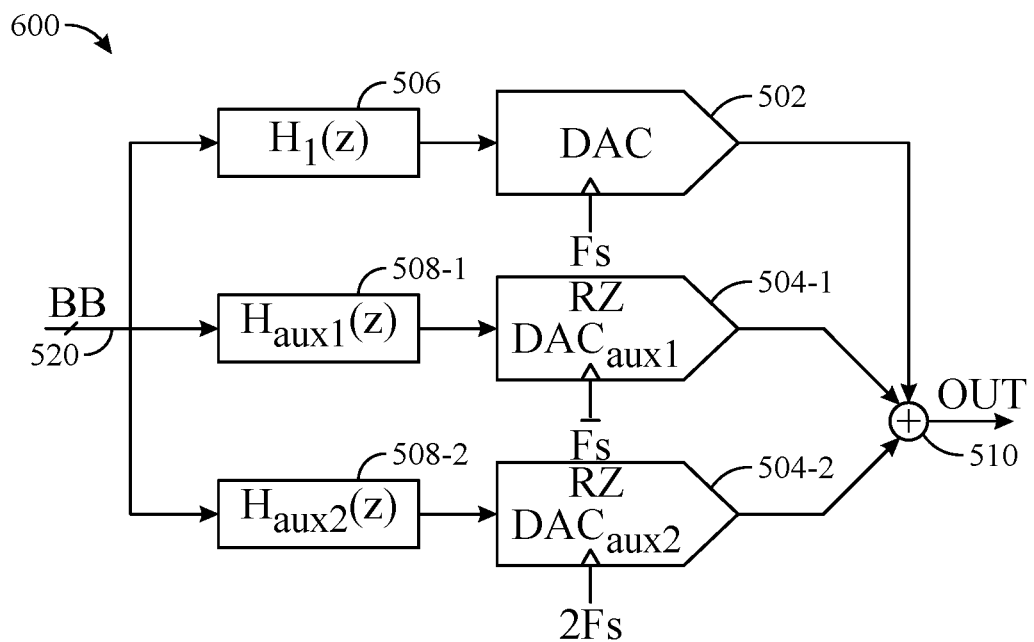
FIG. 6A illustrates a DAC system including a zero-order hold DAC and two RZ DACs receiving sampling clocks having different frequencies, in accordance with certain aspects of the present disclosure.

FIG. 6A illustrates a digital-to-analog conversion system 600 including RZ DACs 504-1 and 504-2, in accordance with certain aspects of the present disclosure. As shown, the DAC 502 receives a clock signal having a frequency fs, the RZ DAC 504-1 receives a clock signal (having a frequency $\overline{fs}$) that is the inverse of the clock signal provided to the DAC 502, and the RZ DAC 504-2 receives a clock signal having a frequency of 2fs.

Figure 6B:
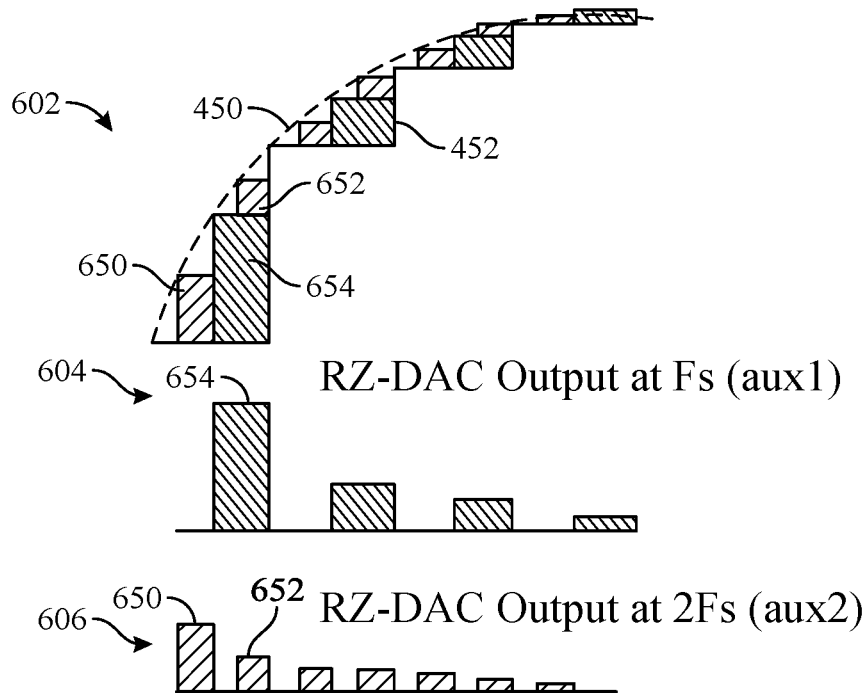
FIG. 6B illustrates graphs showing analog output signals for the DAC system of FIG. 6A, in accordance with certain aspects of the present disclosure.

FIG. 6B illustrates a graph 602 showing the output of the combiner 510 of FIG. 6A, a graph 604 showing the output of the RZ DAC 504-1 of FIG. 6A, and a graph 606 showing the output of the RZ DAC 504-2 of FIG. 6A. For each RZ DAC (e.g., RZ DAC 504-1), a digital filter (e.g., digital filter circuit 508-1) generates a filtered digital input such that the RZ DAC (e.g., in combination with another RZ DAC) generates an analog output representing the difference between the ideal waveform 450 and the analog output 452 of the DAC 502. For example, the RZ DAC 504-2 generates an analog output 650 representing the difference between the analog output 452 and the ideal waveform 450. The RZ DAC 504-2 also generates analog output 652, that when combined with the analog output 654 generated by RZ DAC 504-1, represents the difference between the analog output 452 and the ideal waveform 450.

The RZ DAC 504-1 samples and provides an analog output at a frequency of fs, and the RZ DAC 504-1 samples and provides an analog output at a frequency of 2fs, as shown by graphs 604, 606, respectively. As shown by graph 602, the analog outputs of the RZ DACs 504-1 and 504-2 fill in the gap between the analog output 452 and the ideal waveform 450, in effect canceling (or at least reducing) the image signals associated with digital-to-analog conversion. The RZ DAC 504-1 reduces the image signals near fs and 3fs, and the RZ DAC 504-2 reduces the image signals near 2fs.

Figure 7A:
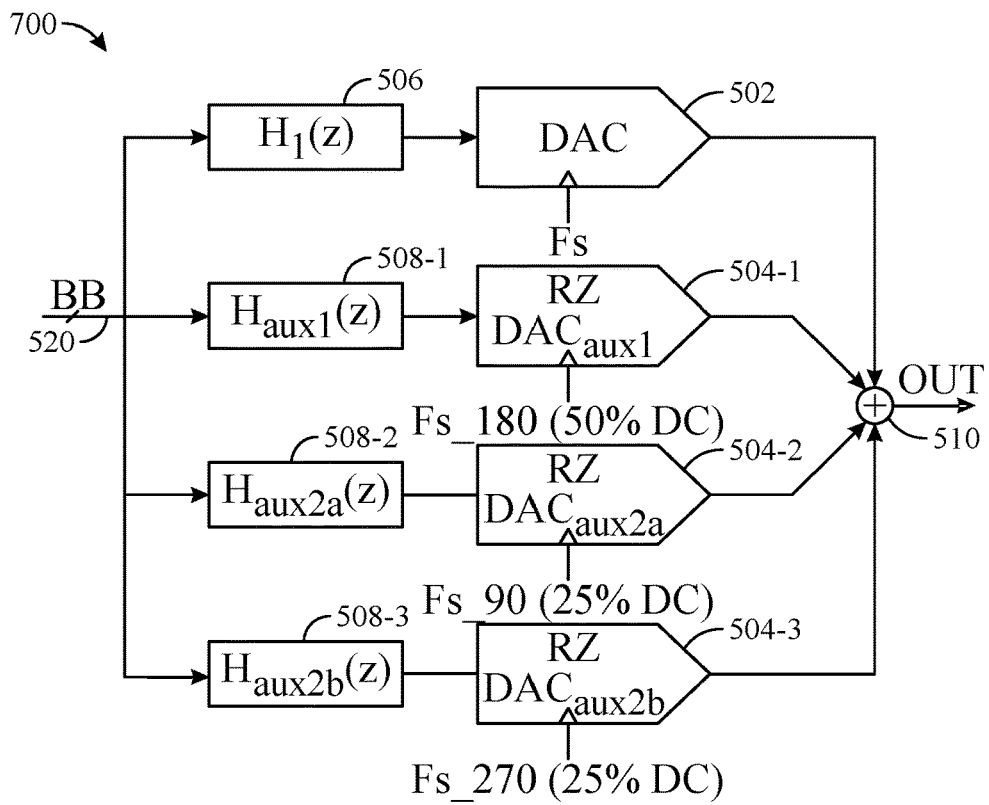
FIG. 7A illustrates a DAC system including a zero-order hold DAC and three RZ DACs receiving sampling clocks having the same frequency, but different phases, in accordance with certain aspects of the present disclosure.

FIG. 7A illustrates a digital-to-analog conversion system 700 including RZ DACs 504-1 and 504-2, as well as RZ DAC 504-3, in accordance with certain aspects of the present disclosure. As shown, the DAC 502 receives a clock signal having a frequency fs and 50% duty cycle, the RZ DAC 504-1 receives a clock signal having a frequency $\overline{fs}$ (which is fs with a 180° phase shift relative to the clock signal of DAC 502) that is the inverse of the clock signal provided to the DAC 502, and the RZ DAC 504-2 receives a clock signal having a frequency of fs with a 90° phase shift (e.g., relative to the clock signal of DAC 502) and 25% duty cycle, and RZ DAC 504-3 receives a clock signal having a frequency of fs with a 270° phase shift (e.g., relative to the clock signal of DAC 502) and a 25% duty cycle.

Figure 7B:
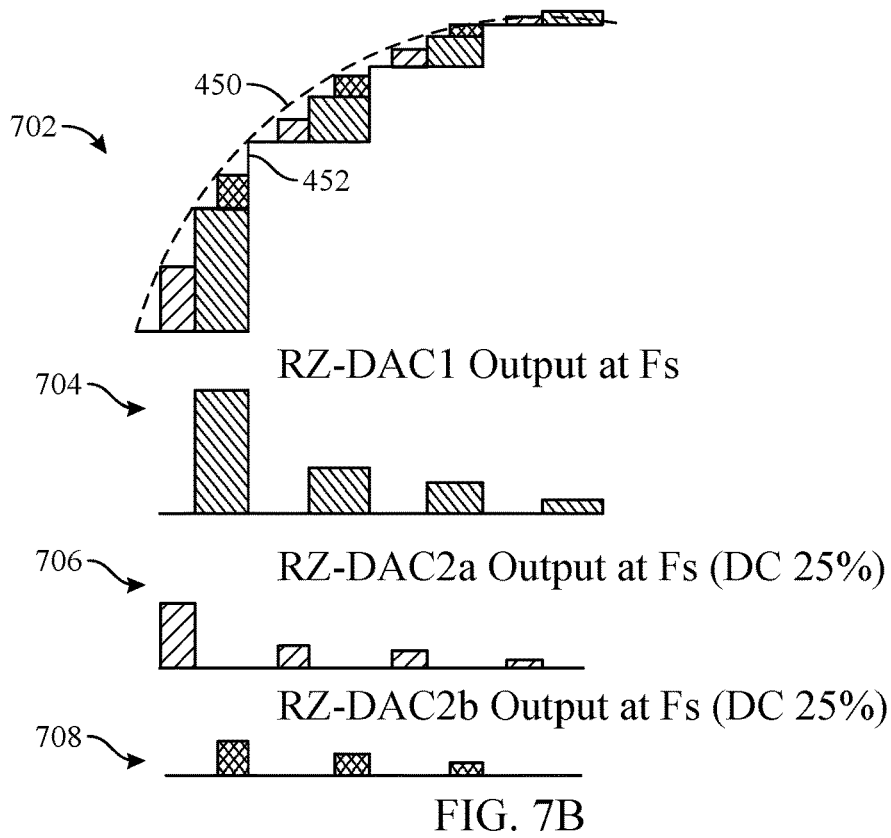
FIG. 7B illustrates graphs showing analog output signals for the DAC system of FIG. 7A, in accordance with certain aspects of the present disclosure.

FIG. 7B illustrates a graph 702 showing the output of the combiner 510 of FIG. 7A, a graph 704 showing the output of the RZ DAC 504-1 of FIG. 7A, a graph 706 showing the output of the RZ DAC 504-2 of FIG. 7A, and a graph 708 showing the output of the RZ DAC 504-3 of FIG. 7A. The RZ DAC 504-1 samples and provides an analog output at a frequency of fs as shown by graph 704. The RZ DAC 504-1 samples and provides an analog output based on a clock signal having a frequency of fs with a 25% duty cycle and 90° phase shift (e.g., relative to the clock signal of DAC 502) as shown by graph 706. The RZ DAC 504-2 samples and provides an analog output based on a clock signal having a frequency of fs with a 25% duty cycle and 270° phase shift (e.g., relative to the clock signal of DAC 502) as shown by graph 708.

As shown by graph 702, the analog outputs of the RZ DACs 504-1, 504-2, and 504-3 fill in the gap between the analog output 452 generated by DAC 502 and the ideal waveform 450, in effect canceling (or at least reducing) the image signals associated with digital-to-analog conversion. The RZ DAC 504-1 reduces the image signals near fs and 3fs, and the RZ DACs 504-2 and 504-3 reduce the image signals near 2fs.

Figure 8A:
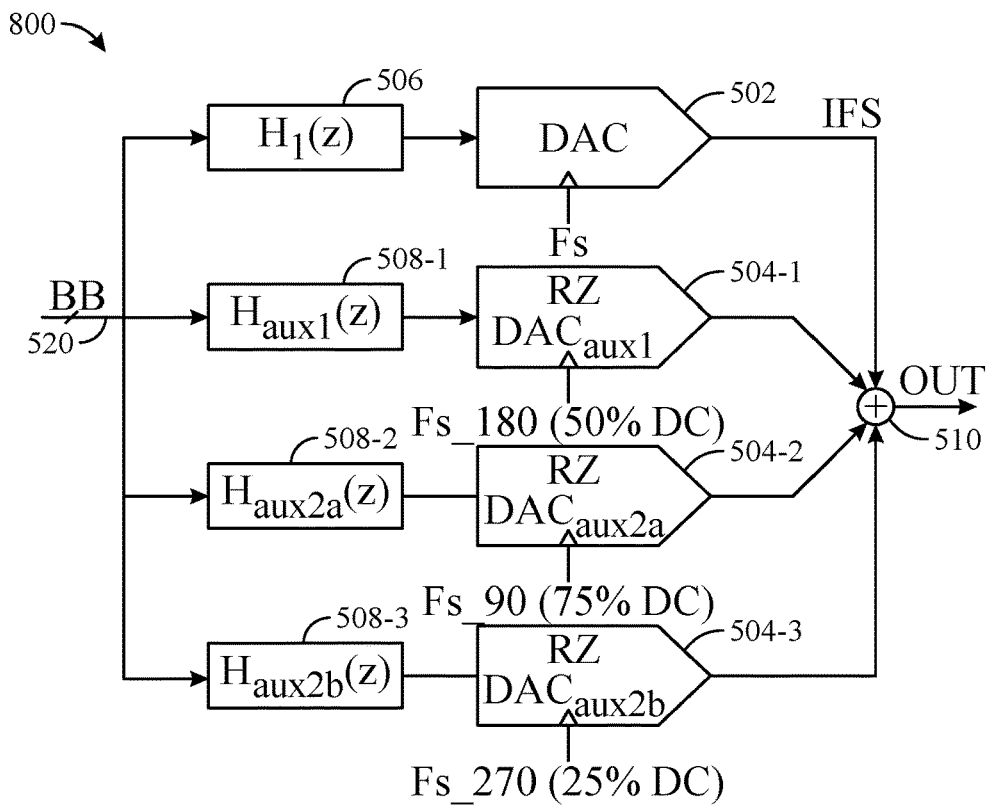
FIG. 8A illustrates a DAC system including a zero-order hold DAC and three RZ DACs receiving sampling clocks with different duty cycles, different phases, and the same frequency, in accordance with certain aspects of the present disclosure.

FIG. 8A illustrates a digital-to-analog conversion system 800 including RZ DACs 504-1, 504-2, and 504-3, in accordance with certain aspects of the present disclosure. As shown, the DAC 502 receives a clock signal having a frequency fs and 50% duty cycle. The RZ DAC 504-1 receives a clock signal having a frequency fs, which is the inverse of the clock signal provided to the DAC 502 (or could also be considered as fs with a 180° phase shift). The RZ DAC 504-2 receives a clock signal having a frequency of fs with a 90° phase shift (e.g., relative to the clock signal of DAC 502) and 75% duty cycle. The RZ DAC 504-3 receives a clock signal having a frequency of fs with a 270° phase shift (e.g., relative to the clock signal of DAC 502) and a 25% duty cycle.

Figure 8B:
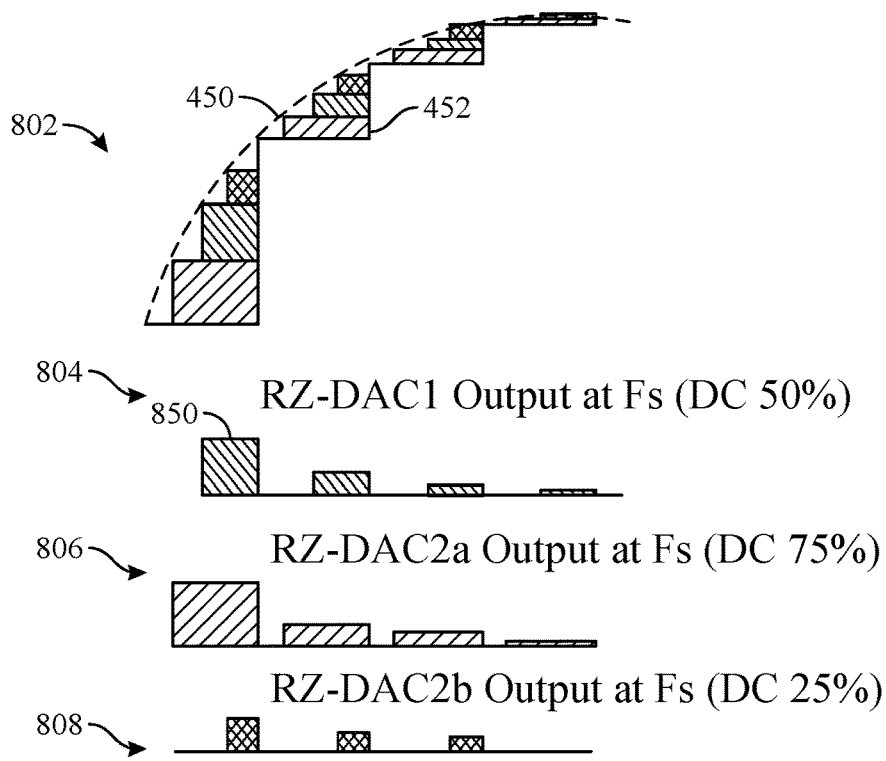
FIG. 8B illustrates graphs showing analog output signals for the DAC system of FIG. 8A, in accordance with certain aspects of the present disclosure.

FIG. 8B illustrates a graph 802 showing the output of the combiner 510 of FIG. 8A, a graph 804 showing the output of the RZ DAC 504-1 of FIG. 8A, a graph 806 showing the output of the RZ DAC 504-2 of FIG. 8A, and a graph 808 showing the output of the RZ DAC 504-3 of FIG. 8A. The RZ DAC 504-1 samples and provides an analog output based on a clock signal having a frequency of fs as shown by graph 804. The RZ DAC 504-1 samples and provides an analog output based on a clock signal having a frequency of fs with a 75% duty cycle and 90° phase shift, as shown by graph 806. The RZ DAC 504-2 samples and provides an analog output based on a clock signal having a frequency of fs with a 25% duty cycle and 270° phase shift as shown by graph 808. As shown by graph 802, the analog outputs of the RZ DACs 504-1, 504-2, and 504-3 fill in the gap between the analog output 452 generated by DAC 502 and the ideal waveform 450, in effect canceling (or at least reducing) the image signals associated with digital-to-analog conversion.

Implementing the RZ DACs with different duty cycles (e.g., 25%, 50%, and 75%) reduces the amplitude of the analog output generated by the RZ DACs. In other words, regardless of the digital input, the outputs of the RZ DACs are combined to fill the gap between the analog output 452 and the ideal waveform 450. Thus, the analog output 850 of the RZ DAC 504-1 may have a relatively lower amplitude as compared to the analog output of RZ DAC 504-1 in other implementations (e.g., analog output 654 shown in FIG. 6B).

Figure 9A:
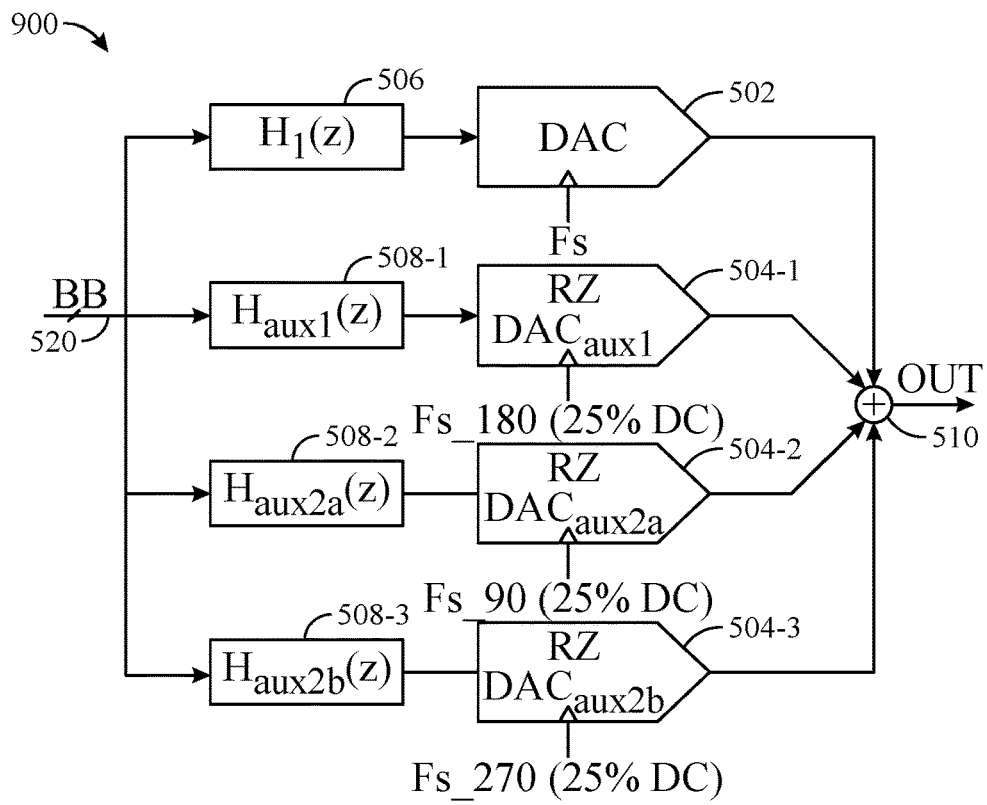
FIG. 9A illustrates a DAC system including a zero-order hold DAC and three RZ DACs receiving sampling clocks with the same duty cycle and the same frequency, but different phases, in accordance with certain aspects of the present disclosure.

FIG. 9A illustrates a digital-to-analog conversion system 900 including RZ DACs 504-1, 504-2, and 504-3, in accordance with certain aspects of the present disclosure. As shown, the DAC 502 receives a clock signal having a frequency fs, the RZ DAC 504-1 receives a clock signal having a frequency fs with a 180° phase shift and a 25% duty cycle, the RZ DAC 504-2 receives a clock signal having a frequency of fs with a 90° phase shift and a 25% duty cycle, and RZ DAC 504-3 receives a clock signal having a frequency of fs with a 270° phase shift and a 25% duty cycle.

Figure 9B:
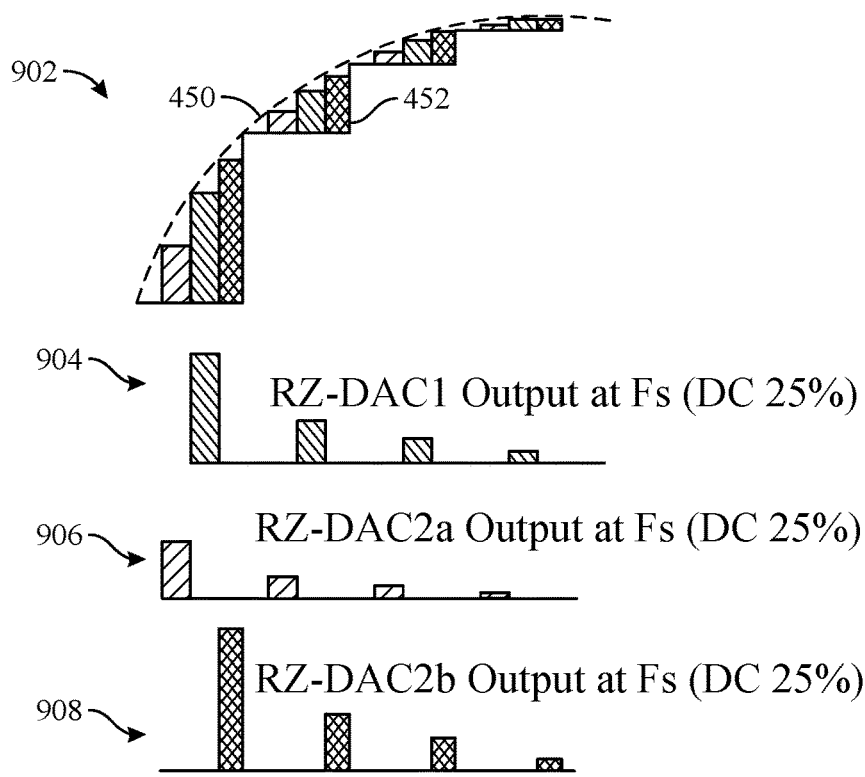
FIG. 9B illustrates graphs showing analog output signals for the DAC system of FIG. 9A, in accordance with certain aspects of the present disclosure.

FIG. 9B illustrates a graph 902 showing the output of the combiner 510 of FIG. 9A, a graph 904 showing the output of the RZ DAC 504-1 of FIG. 9A, a graph 906 showing the output of the RZ DAC 504-2 of FIG. 9A, and a graph 908 showing the output of the RZ DAC 504-3 of FIG. 9A. The RZ DAC 504-1 samples and provides an analog output based on a clock signal having a frequency of fs with a 25% duty cycle and 180° phase shift as shown by graph 904. The RZ DAC 504-2 samples and provides an analog output based on a clock signal having a frequency of fs with a 25% duty cycle and 90° phase shift as shown by graph 906. The RZ DAC 504-3 samples and provides an analog output based on a clock signal having a frequency of fs with a 25% duty cycle and 270° phase shift as shown by graph 908. As shown by graph 802, the analog outputs of the RZ DACs 504-1, 504-2, and 504-3 fill in the gap between the analog output 452 generated by DAC 502 and the ideal waveform 450, in effect canceling (or at least reducing) the image signals associated with digital-to-analog conversion.

Implementing the RZ DACs with the same duty cycles (e.g., 25%) and different phase shifts results in the RZ DACs providing non-overlapping analog outputs. As a result, the same current source may be used to provide power to the RZ DACs. In other words, since only one of the RZ DACs is generating an analog output at any particular time, the same current source may be used for the RZ DACs, reducing the area consumption of the DAC hardware.

Figure 10A:
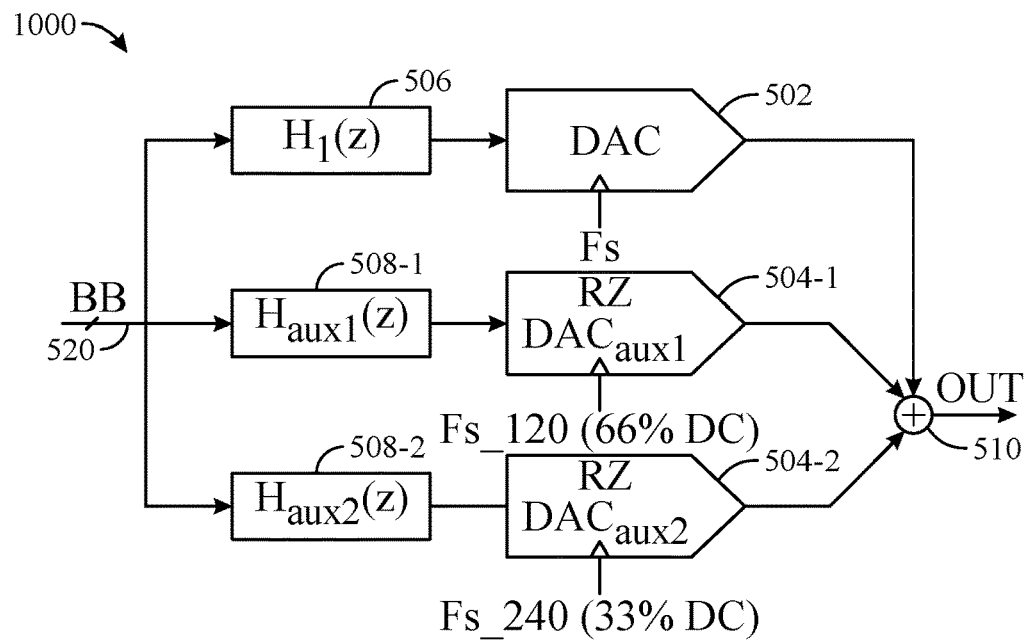
FIG. 10A illustrates a DAC system including a zero-order hold DAC and two RZ DACs receiving three-phase sampling clocks with different duty cycles, in accordance with certain aspects of the present disclosure.

FIG. 10A illustrates a digital-to-analog conversion system 1000 including RZ DACs 504-1 and 504-2, in accordance with certain aspects of the present disclosure. As shown, the DAC 502 receives a clock signal having a frequency fs, the RZ DAC 504-1 receives a clock signal having a frequency of fs with a 120° phase shift and 66% duty cycle, and RZ DAC 504-2 receives a clock signal having a frequency of fs with a 240° phase shift and a 33% duty cycle.

Figure 10B:
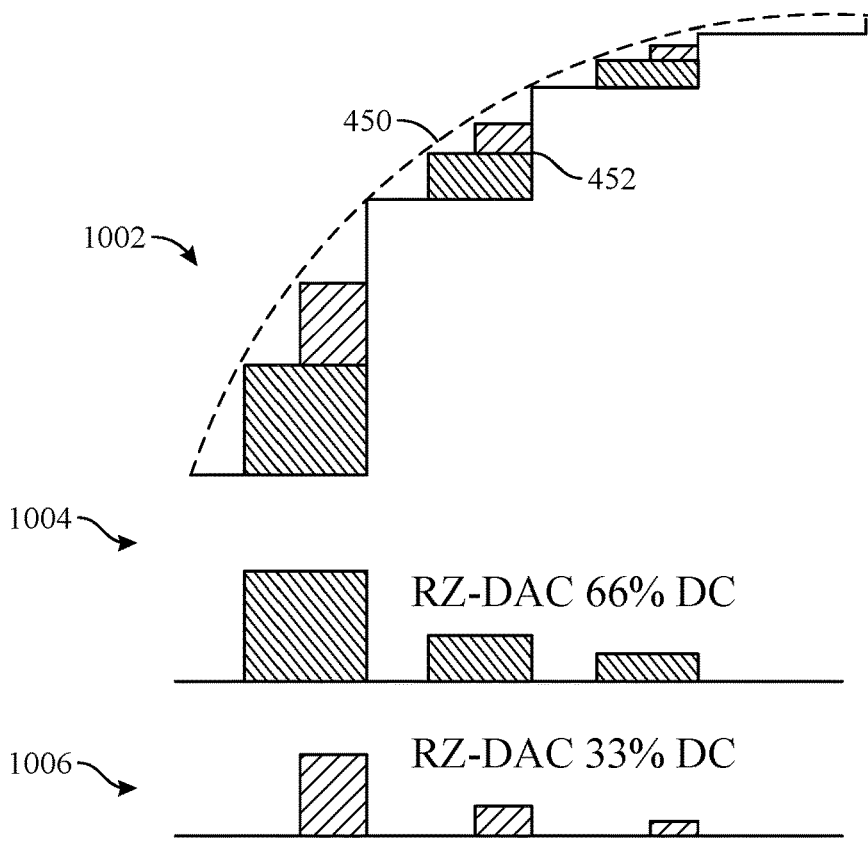
FIG. 10B illustrates graphs showing analog output signals for the DAC system of FIG. 10A, in accordance with certain aspects of the present disclosure.

FIG. 10B illustrates a graph 1002 showing the output of the combiner 510 of FIG. 10A, a graph 1004 showing the output of the RZ DAC 504-1 of FIG. 10A, and a graph 1006 showing the output of the RZ DAC 504-2 of FIG. 10A. The RZ DAC 504-1 samples and provides an analog output based on a clock signal having a frequency of fs with a 66% duty cycle and 120° phase shift as shown by graph 1004, and the RZ DAC 504-2 samples and provides an analog output based on a clock signal having a frequency of fs with a 33% duty cycle and 240° phase shift as shown by graph 1006.

As shown by graph 1002, the analog outputs of the RZ DACs 504-1 and 504-2 fill in the gap between the analog output 452 generated by DAC 502 and the ideal waveform 450, in effect canceling (or at least reducing) the image signals associated with digital-to-analog conversion, near fs and 2fs. The implementation shown in FIGS. 10A and 10B allows for reduction of image signals with less hardware (e.g., only two RZ DACs instead of three), but involves generating a 3-phase clock and using 33% and 66% duty cycles.

Using the RZ DACs provides a more precise DAC image cancellation architecture as compared to conventional implementations. Some aspects allow for FIR coefficient design reuse from another digital interpolator. In other words, one or more coefficients used to implement the digital filter circuit 506 may also be used for one or more of digital filter circuits 508. Using the RZ DACs for image cancellation provides an analog output with less band-edge droop than conventional implementations. That is, the output signal of conventional DACs may have a voltage droop at the sampling frequency, which is reduced when using the RZ DAC image cancellation technique described herein. The RZ DAC image cancellation technique also provides flexibility in deciding how many image signals to cancel and can be combined with other image cancellation techniques, such as DAC interleaving techniques.

Figure 11:
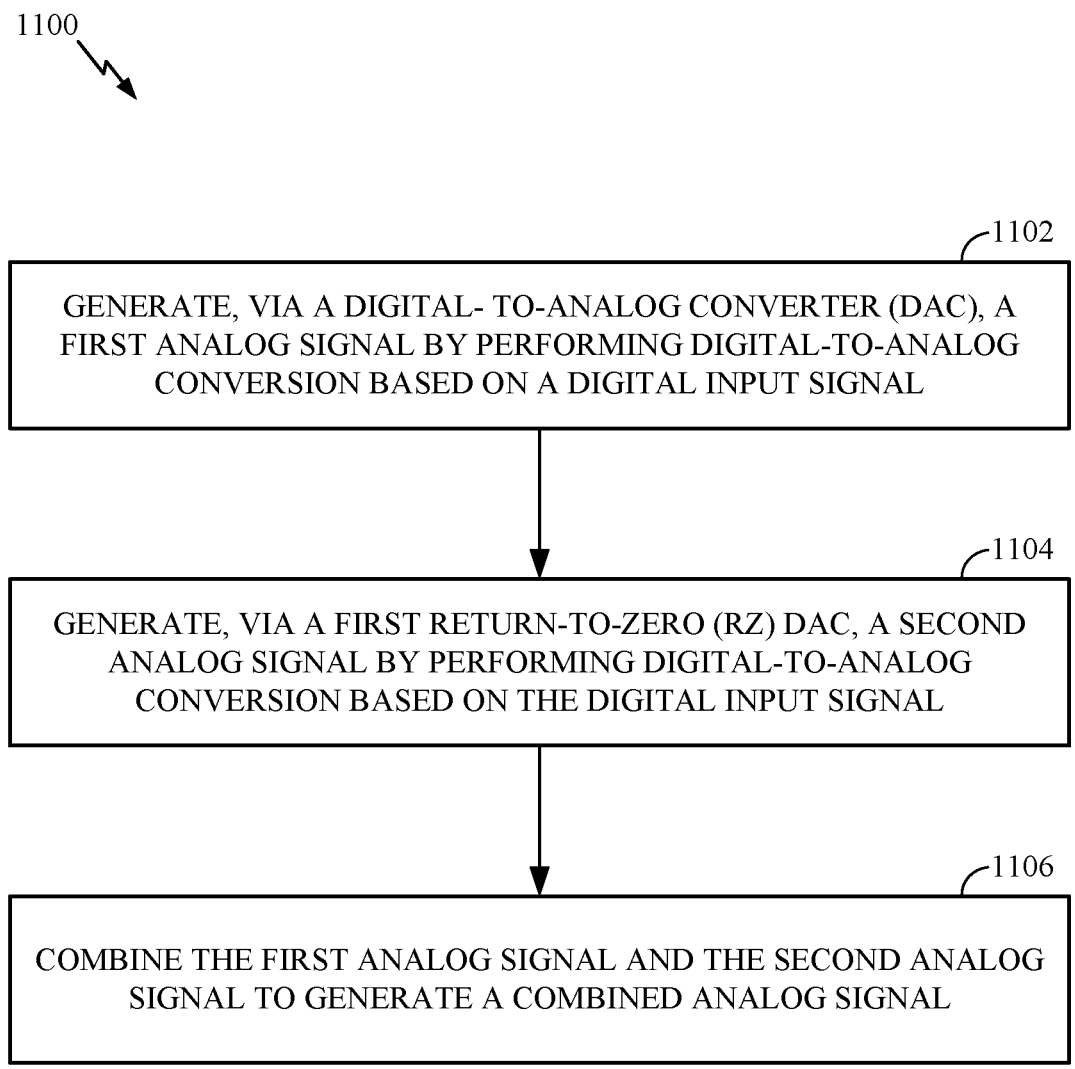
FIG. 11 is a flow diagram illustrating example operations for digital-to-analog conversion, in accordance with certain aspects of the present disclosure.

FIG. 11 is a flow diagram illustrating example operations 1100 for digital-to-analog conversion, in accordance with certain aspects of the present disclosure. The operations 1100 may be performed, for example, by a DAC system such as the digital-to-analog conversion system 500 of FIG. 5, the digital-to-analog conversion system 600 of FIG. 6A, the digital-to-analog conversion system 700 of FIG. 7A, the digital-to-analog conversion system 800 of FIG. 8A, the digital-to-analog conversion system 900 of FIG. 9A, or the digital-to-analog conversion system 1000 of FIG. 10A.

The operations 1100 begin, at block 1102, with the DAC system generating, via a DAC (e.g., zero-order hold DAC 502), a first analog signal by performing digital-to-analog conversion based on a digital input signal (e.g., at digital input 520). At block 1104, the DAC system generates, via a first RZ DAC (e.g., RZ DAC 504-1), a second analog signal by performing digital-to-analog conversion based on the digital input signal. For example, the second analog signal may have a magnitude that is equal to a difference between the first analog signal and a value representing the digital input signal. At block 1106, the DAC system combines (e.g., via combiner 510) the first analog signal and the second analog signal to generate a combined analog signal.

In some aspects, the DAC system also generates, via a second RZ DAC (e.g., RZ DAC 504-2), a third analog signal based on the digital input signal. The combining at block 1106 may include combining the first analog signal, the second analog signal, and the third analog signal.

In some aspects, the first analog signal is generated based on a first sampling clock (e.g., a clock signal having a frequency fs as shown in FIG. 6A). The second analog signal (e.g., generated by RZ DAC 504-1 shown in FIG. 6A) may be generated based on a second sampling clock (e.g., having a frequency fs), the second sampling clock having the same frequency as the first sampling clock. The second sampling clock may be phase-shifted from the first sampling clock by 180°. The third analog signal (e.g., generated by RZ DAC 504-2 shown in FIG. 6A) may be generated based on a third sampling clock, the third sampling clock having a frequency that is twice a frequency of the first sampling clock.

In some aspects, the DAC system generates, via a third RZ DAC (e.g., 504-3), a fourth analog signal based on the digital input signal. The combining at block 1106 includes combining the first analog signal, the second analog signal, the third analog signal, and the fourth analog signal.

In some aspects, the first analog signal is generated based on a first sampling clock, and the second analog signal (e.g., generated by RZ DAC 504-1 shown in FIG. 7A) is generated based on a second sampling clock, the second sampling clock having the same frequency and having a phase shift of 180° as compared to the first sampling clock. Moreover, the third analog signal (e.g., generated by RZ DAC 504-2 shown in FIG. 7A) is generated based on a third sampling clock having a 25% duty cycle, the third sampling clock having the same frequency and having a phase shift of 90° as compared to the first sampling clock. The fourth analog signal (e.g., generated by RZ DAC 504-3 shown in FIG. 7A) may be generated based on a fourth sampling clock having a 25% duty cycle, the fourth sampling clock having the same frequency and having a phase shift of 270° as compared to the first sampling clock.

In some aspects, the first analog signal (e.g., generated by DAC 502 shown in FIG. 8A) is generated based on a first sampling clock, and the second analog signal (e.g., generated by RZ DAC 504-1 shown in FIG. 8A) is generated based on a second sampling clock, the second sampling clock having the same frequency and having a phase shift of 180° as compared to the first sampling clock. Moreover, the third analog signal may be generated based on a third sampling clock having a 75% duty cycle, the third sampling clock having the same frequency and having a phase shift of 90° as compared to the first sampling clock, and the fourth analog signal may be generated based on a fourth sampling clock having a 25% duty cycle, the fourth sampling clock having the same frequency and having a phase shift of 270° as compared to the first sampling clock.

In some aspects, the first analog signal (e.g., generated by RZ DAC 504-2 shown in FIG. 9A) is generated based on a first sampling clock, and the second analog signal (e.g., generated by RZ DAC 504-1 shown in FIG. 9A) is generated based on a second sampling clock having a 25% duty cycle, the second sampling clock having the same frequency and having a phase shift of 180° as compared to the first sampling clock. Moreover, the third analog signal (e.g., generated by RZ DAC 504-2 shown in FIG. 9A) may be generated based on a third sampling clock having a 25% duty cycle, the third sampling clock having the same frequency and having a phase shift of 90° as compared to the first sampling clock, and the fourth analog signal (e.g., generated by RZ DAC 504-3 shown in FIG. 9A) may be generated based on a fourth sampling clock having a 25% duty cycle, the fourth sampling clock having the same frequency and having a phase shift of 270° as compared to the first sampling clock.

In some aspects, the first analog signal (e.g., generated by DAC 502 shown in FIG. 10A) is generated based on a first sampling clock, and the second analog signal (e.g., generated by RZ DAC 504-1 shown in FIG. 10A) is generated based on a second sampling clock having a 66% duty cycle, the second sampling clock having the same frequency and having a phase shift of 120° as compared to the first sampling clock. Moreover, the third analog signal (e.g., generated by RZ DAC 504-2 shown in FIG. 10A) may be generated based on a third sampling clock having a 33% duty cycle, the third sampling clock having the same frequency and having a phase shift of 240° as compared to the first sampling clock.

In some aspects, the DAC system generates, via a first filter circuit (e.g., digital filter circuit 506), a first filtered version of the digital input signal, wherein the first analog signal is generated based on the first filtered version of the digital input signal. The DAC system also generates, via a second filter circuit (e.g., digital filter circuit 508-1), a second filtered version of the digital input signal, wherein the second analog signal is generated based on the second filtered version of the digital input signal.

EXAMPLE ASPECTS

In addition to the various aspects described above, specific combinations of aspects are within the scope of the disclosure, some of which are detailed below:

Aspect 1. A device for digital-to-analog conversion, comprising: a digital-to-analog converter (DAC) having an input coupled to an input node of the device; a first return-to-zero (RZ) DAC having an input coupled to the input node of the device; and a combiner, wherein an output of the DAC is coupled to a first input of the combiner, and wherein an output of the first RZ DAC is coupled to a second input of the combiner.

Aspect 2. The device of claim 1, further comprising a second RZ DAC having an input coupled to the input node of the device, wherein an output of the second RZ DAC is coupled to a third input of the combiner.

Aspect 3. The device of claim 2, wherein: the DAC is configured to perform digital-to-analog conversion of an input signal at the input node based on a first sampling clock; the first RZ DAC is configured to perform digital-to-analog conversion of the input signal based on a second sampling clock, the second sampling clock having the same frequency as the first sampling clock; and the second RZ DAC is configured to perform digital-to-analog conversion of the input signal based on a third sampling clock, the third sampling clock having a frequency that is twice the frequency of the first sampling clock.

Aspect 4. The device of claim 3, wherein the second sampling clock is phase shifted from the first sampling clock by 180°.

Aspect 5. The device of claim 2, further comprising a third RZ DAC having an input coupled to the input node of the device, wherein an output of the third RZ DAC is coupled to a fourth input of the combiner.

Aspect 6. The device of claim 5, wherein: the DAC is configured to perform digital-to-analog conversion of an input signal at the input node based on a first sampling clock; the first RZ DAC is configured to perform digital-to-analog conversion of the input signal based on a second sampling clock, the second sampling clock having the same frequency and having a phase shift of 180° as compared to the first sampling clock; the second RZ DAC is configured to perform digital-to-analog conversion of the input signal based on a third sampling clock having a 25% duty cycle, the third sampling clock having the same frequency and having a phase shift of 90° as compared to the first sampling clock; and the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

Aspect 7. The device of claim 5, wherein: the DAC is configured to perform digital-to-analog conversion of an input signal at the input node based on a first sampling clock; the first RZ DAC is configured to perform digital-to-analog conversion of the input signal based on a second sampling clock, the second sampling clock having the same frequency and having a phase shift of 180° as compared to the first sampling clock; the second RZ DAC is configured to perform digital-to-analog conversion of the input signal based on a third sampling clock having a 75% duty cycle, the third sampling clock having the same frequency and having a phase shift of 90° as compared to the first sampling clock; and the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

Aspect 8. The device of claim 5, wherein: the DAC is configured to perform digital-to-analog conversion of an input signal at the input node based on a first sampling clock; the first RZ DAC is configured to perform digital-to-analog conversion of the input signal based on a second sampling clock having a 25% duty cycle, the second sampling clock having the same frequency and having a phase shift of 180° as compared to the first sampling clock; the second RZ DAC is configured to perform digital-to-analog conversion of the input signal based on a third sampling clock having a 25% duty cycle, the third sampling clock having the same frequency and having a phase shift of 90° as compared to the first sampling clock; and the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

Aspect 9. The device of claim 2, wherein: the DAC is configured to perform digital-to-analog conversion of an input signal at the input node based on a first sampling clock; the first RZ DAC is configured to perform digital-to-analog conversion of the input signal based on a second sampling clock having a 66% duty cycle, the second sampling clock having the same frequency and having a phase shift of 120° as compared to the first sampling clock; and the second RZ DAC is configured to perform digital-to-analog conversion of the input signal based on a third sampling clock having a 33% duty cycle, the third sampling clock having the same frequency and having a phase shift of 240° as compared to the first sampling clock.

Aspect 10. The device of claim 1, further comprising: a first filter circuit coupled between the input node of the device and the input of the DAC; and a second filter circuit coupled between the input node of the device and the input of the DAC, wherein the second filter circuit has a different transfer function than the first filter circuit.

Aspect 11. The device of claim 1, wherein: the DAC is configured to generate a first analog signal based on a digital input signal; and the first RZ DAC is configured to generate a second analog signal, the second analog signal having a magnitude that is equal to a difference between the first analog signal and a value representing the digital input signal.

Aspect 12. The device of claim 1, wherein the first DAC comprises a zero-order hold DAC.

Aspect 13. A method for digital-to-analog conversion, comprising: generating, via a digital-to-analog converter (DAC), a first analog signal by performing digital-to-analog conversion based on a digital input signal; generating, via a first return-to-zero (RZ) DAC, a second analog signal by performing digital-to-analog conversion based on the digital input signal; and combining the first analog signal and the second analog signal to generate a combined analog signal.

Aspect 14. The method of claim 13, further comprising generating, via a second RZ DAC, a third analog signal based on the digital input signal, wherein the combining includes combining the first analog signal, the second analog signal, and the third analog signal.

Aspect 15. The method of claim 14, wherein: the first analog signal is generated based on a first sampling clock; the second analog signal is generated based on a second sampling clock, the second sampling clock having the same frequency as the first sampling clock; and the third analog signal is generated based on a third sampling clock, the third sampling clock having a frequency that is twice the frequency of the first sampling clock.

Aspect 16. The method of claim 15, wherein the second sampling clock is phase shifted from the first sampling clock by 180°.

Aspect 17. The method of claim 14, further comprising: generating, via a third RZ DAC, a fourth analog signal based on the digital input signal, wherein the combining includes combining the first analog signal, the second analog signal, the third analog signal, and the fourth analog signal.

Aspect 18. The method of claim 17, wherein: the first analog signal is generated based on a first sampling clock; the second analog signal is generated based on a second sampling clock, the second sampling clock having the same frequency and having a phase shift of 180° as compared to the first sampling clock; the third analog signal is generated based on a third sampling clock having a 25% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

Aspect 19. The method of claim 17, wherein: the first analog signal is generated based on a first sampling clock; the second analog signal is generated based on a second sampling clock, the second sampling clock having the same frequency and having a phase shift of 180° as compared to the first sampling clock; the third analog signal is generated based on a third sampling clock having a 75% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

Aspect 20. The method of claim 17, wherein: the first analog signal is generated based on a first sampling clock; the second analog signal is generated based on a second sampling clock having a 25% duty cycle, the second sampling clock having the same frequency and having a phase shift of 180° as compared to the first sampling clock; the third analog signal is generated based on a third sampling clock having a 25% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

Aspect 21. The method of claim 14, wherein: the first analog signal is generated based on a first sampling clock; the second analog signal is generated based on a second sampling clock having a 66% duty cycle, the second sampling clock having the same frequency and having a phase shift of 120° as compared to the first sampling clock; and the third analog signal is generated based on a third sampling clock having a 33% duty cycle, the third sampling clock having the same frequency and having a phase shift of 240° as compared to the first sampling clock.

Aspect 22. The method of claim 13, further comprising: generating, via a first filter circuit, a first filtered version of the digital input signal, wherein the first analog signal is generated based on the first filtered version of the digital input signal; and generating, via a second filter circuit, a second filtered version of the digital input signal, wherein the second analog signal is generated based on the second filtered version of the digital input signal.

Aspect 23. The method of claim 13, wherein the second analog signal has a magnitude that is equal to a difference between the first analog signal and a value representing the digital input signal.

Aspect 24. The method of claim 13, wherein the DAC comprises a zero-order hold DAC.

Aspect 25. An apparatus for digital-to-analog conversion, comprising: a digital-to-analog converter (DAC) configured to generate a first analog signal by performing digital-to-analog conversion based on a digital input signal; a first return-to-zero (RZ) DAC configured to generate a second analog signal by performing digital-to-analog conversion based on the digital input signal; and a combiner configured to combine the first analog signal and the second analog signal to generate a combined analog signal.

Aspect 26. The apparatus of claim 25, further comprising a second RZ DAC configured to generate a third analog signal based on the digital input signal, wherein the combiner is configured to combine the first analog signal, the second analog signal, and the third analog signal.

Aspect 27. The apparatus of claim 26, wherein: the DAC is configured to generate the first analog signal based on a first sampling clock; the first RZ DAC is configured to generate the second analog signal based on a second sampling clock, the second sampling clock having the same frequency as the first sampling clock; and the second RZ DAC is configured to generate the third analog signal based on a third sampling clock, the third sampling clock having a frequency that is twice the frequency of the first sampling clock.

Aspect 28. The apparatus of claim 27, wherein the second sampling clock is phase shifted from the first sampling clock by 180°.

Aspect 29. The apparatus of claim 26, further comprising a third RZ DAC configured to generate a fourth analog signal based on the digital input signal, wherein the combiner is configured to combine the first analog signal, the second analog signal, the third analog signal, and the fourth analog signal.

Aspect 30. The apparatus of claim 29, wherein: the DAC is configured to generate the first analog signal based on a first sampling clock; the first RZ DAC is configured to generate the second analog signal based on a second sampling clock, the second sampling clock having the same frequency and having a phase shift of 180° as compared to the first sampling clock; the second RZ DAC is configured to generate the third analog signal based on a third sampling clock having a 25% duty cycle, the third sampling clock having the same frequency and having a phase shift of 90° as compared to the first sampling clock; and the third RZ DAC is configured to generate the fourth analog signal based on a fourth sampling clock having a 25% duty cycle, the fourth sampling clock having the same frequency and having a phase shift of 270° as compared to the first sampling clock.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. Means for generating may include a digital-to-analog converter (DAC), such as the DAC 502 or DACs 504. Means for combining may include a combiner, such as the combiner 510.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A device for digital-to-analog conversion, comprising:
   a digital-to-analog converter (DAC) having an input coupled to an input node of the device, wherein the DAC is not a return-to-zero (RZ) DAC;
   a first RZ DAC having an input coupled to the input node of the device; and
   a combiner, wherein an output of the DAC is coupled to a first input of the combiner and wherein an output of the first RZ DAC is coupled to a second input of the combiner.

2. The device of claim 1, further comprising a second RZ DAC having an input coupled to the input node of the device, wherein an output of the second RZ DAC is coupled to a third input of the combiner.

3. The device of claim 2, wherein:
   the DAC is configured to perform digital-to-analog conversion of an input signal at the input node based on a first sampling clock;
   the first RZ DAC is configured to perform digital-to-analog conversion of the input signal based on a second sampling clock, the second sampling clock having the same frequency as the first sampling clock; and
   the second RZ DAC is configured to perform digital-to-analog conversion of the input signal based on a third sampling clock, the third sampling clock having a frequency that is twice the frequency of the first sampling clock.

4. The device of claim 3, wherein the second sampling clock is phase shifted from the first sampling clock by 180°.

5. The device of claim 2, further comprising a third RZ DAC having an input coupled to the input node of the device, wherein an output of the third RZ DAC is coupled to a fourth input of the combiner.

6. The device of claim 5, wherein:
   the DAC is configured to perform digital-to-analog conversion of an input signal at the input node based on a first sampling clock;
   the first RZ DAC is configured to perform digital-to-analog conversion of the input signal based on a second sampling clock, the second sampling clock having the same frequency and having a phase shift of 180° as compared to the first sampling clock;
   the second RZ DAC is configured to perform digital-to-analog conversion of the input signal based on a third sampling clock having a 25% duty cycle, the third sampling clock having the same frequency and having a phase shift of 90° as compared to the first sampling clock; and
   the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

7. The device of claim 5, wherein:
   the DAC is configured to perform digital-to-analog conversion of an input signal at the input node based on a first sampling clock;
   the first RZ DAC is configured to perform digital-to-analog conversion of the input signal based on a second sampling clock, the second sampling clock having the same frequency and having a phase shift of 180° as compared to the first sampling clock;
   the second RZ DAC is configured to perform digital-to-analog conversion of the input signal based on a third sampling clock having a 75% duty cycle, the third sampling clock having the same frequency and having a phase shift of 90° as compared to the first sampling clock; and
   the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

8. The device of claim 5, wherein:
   the DAC is configured to perform digital-to-analog conversion of an input signal at the input node based on a first sampling clock;
   the first RZ DAC is configured to perform digital-to-analog conversion of the input signal based on a second sampling clock having a 25% duty cycle, the second sampling clock having the same frequency and having a phase shift of 180° as compared to the first sampling clock;

the second RZ DAC is configured to perform digital-to-analog conversion of the input signal based on a third sampling clock having a 25% duty cycle, the third sampling clock having the same frequency and having a phase shift of 90° as compared to the first sampling clock; and the third RZ DAC is configured to perform digital-to-analog conversion of the input signal based on a fourth sampling clock having a 25% duty cycle, the fourth sampling clock having the same frequency and having a phase shift of 270° as compared to the first sampling clock.

9. The device of claim 2, wherein:

the DAC is configured to perform digital-to-analog conversion of an input signal at the input node based on a first sampling clock;

the first RZ DAC is configured to perform digital-to-analog conversion of the input signal based on a second sampling clock having a 66% duty cycle, the second sampling clock having the same frequency and having a phase shift of 120° as compared to the first sampling clock; and the second RZ DAC is configured to perform digital-to-analog conversion of the input signal based on a third sampling clock having a 33% duty cycle, the third sampling clock having the same frequency and having a phase shift of 240° as compared to the first sampling clock.

10. The device of claim 1, further comprising:

a first filter circuit coupled between the input node of the device and the input of the DAC; and a second filter circuit coupled between the input node of the device and the input of the DAC, wherein the second filter circuit has a different transfer function than the first filter circuit.

11. The device of claim 1, wherein:

the DAC is configured to generate a first analog signal based on a digital input signal; and the first RZ DAC is configured to generate a second analog signal, the second analog signal having a magnitude that is equal to a difference between the first analog signal and a value representing the digital input signal.

12. The device of claim 1, wherein the first DAC comprises a zero-order hold DAC.

13. A method for digital-to-analog conversion, comprising:

generating, via a digital-to-analog converter (DAC), a first analog signal by performing digital-to-analog conversion based on a digital input signal, wherein the DAC is not a return-to-zero (RZ) DAC;

generating, via a first RZ DAC, a second analog signal by performing digital-to-analog conversion based on the digital input signal; and combining the first analog signal and the second analog signal to generate a combined analog signal.

14. The method of claim 13, further comprising generating, via a second RZ DAC, a third analog signal based on the digital input signal, wherein the combining includes combining the first analog signal, the second analog signal, and the third analog signal.

15. The method of claim 14, wherein:

the first analog signal is generated based on a first sampling clock;

the second analog signal is generated based on a second sampling clock, the second sampling clock having the same frequency as the first sampling clock; and the third analog signal is generated based on a third sampling clock, the third sampling clock having a frequency that is twice the frequency of the first sampling clock.

16. The method of claim 15, wherein the second sampling clock is phase shifted from the first sampling clock by 180°.

17. The method of claim 14, further comprising:

generating, via a third RZ DAC, a fourth analog signal based on the digital input signal, wherein the combining includes combining the first analog signal, the second analog signal, the third analog signal, and the fourth analog signal.

18. The method of claim 17, wherein:

the first analog signal is generated based on a first sampling clock;

the second analog signal is generated based on a second sampling clock, the second sampling clock having the same frequency and having a phase shift of 180° as compared to the first sampling clock;

the third analog signal is generated based on a third sampling clock having a 25% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

19. The method of claim 17, wherein:

the first analog signal is generated based on a first sampling clock;

the second analog signal is generated based on a second sampling clock, the second sampling clock having the same frequency and having a phase shift of 180° as compared to the first sampling clock;

the third analog signal is generated based on a third sampling clock having a 75% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

20. The method of claim 17, wherein:

the first analog signal is generated based on a first sampling clock;

the second analog signal is generated based on a second sampling clock having a 25% duty cycle, the second sampling clock having the same frequency and having a phase shift of 180° as compared to the first sampling clock;

the third analog signal is generated based on a third sampling clock having a 25% duty cycle, the third sampling clock having the same frequency and having a phase shift of 90° as compared to the first sampling clock; and the fourth analog signal is generated based on a fourth sampling clock having a 25% duty cycle, the fourth sampling clock having the same frequency and having a phase shift of 270° as compared to the first sampling clock.

21. The method of claim 14, wherein:
the first analog signal is generated based on a first sampling clock;
the second analog signal is generated based on a second sampling clock having a 66% duty cycle, the second sampling clock having the same frequency and having a phase shift of 120° as compared to the first sampling clock; and
the third analog signal is generated based on a third sampling clock having a 33% duty cycle, the third sampling clock having the same frequency and having a phase shift of 240° as compared to the first sampling clock.

22. The method of claim 13, further comprising:
generating, via a first filter circuit, a first filtered version of the digital input signal, wherein the first analog signal is generated based on the first filtered version of the digital input signal; and
generating, via a second filter circuit, a second filtered version of the digital input signal, wherein the second analog signal is generated based on the second filtered version of the digital input signal.

23. The method of claim 13, wherein the second analog signal has a magnitude that is equal to a difference between the first analog signal and a value representing the digital input signal.

24. The method of claim 13, wherein the DAC comprises a zero-order hold DAC.

25. An apparatus for digital-to-analog conversion, comprising:
a digital-to-analog converter (DAC) configured to generate a first analog signal by performing digital-to-analog conversion based on a digital input signal;
a first return-to-zero (RZ) DAC configured to generate a second analog signal by performing digital-to-analog conversion based on the digital input signal, wherein the DAC is a different type of DAC than the first RZ DAC; and
a combiner configured to combine the first analog signal and the second analog signal to generate a combined analog signal.

26. The apparatus of claim 25, further comprising a second RZ DAC configured to generate a third analog signal based on the digital input signal, wherein the combiner is configured to combine the first analog signal, the second analog signal, and the third analog signal.

27. The apparatus of claim 26, wherein:
the DAC is configured to generate the first analog signal based on a first sampling clock;
the first RZ DAC is configured to generate the second analog signal based on a second sampling clock, the second sampling clock having the same frequency as the first sampling clock; and
the second RZ DAC is configured to generate the third analog signal based on a third sampling clock, the third sampling clock having a frequency that is twice the frequency of the first sampling clock.

28. The apparatus of claim 27, wherein the second sampling clock is phase shifted from the first sampling clock by 180°.

29. The apparatus of claim 26, further comprising a third RZ DAC configured to generate a fourth analog signal based on the digital input signal, wherein the combiner is configured to combine the first analog signal, the second analog signal, the third analog signal, and the fourth analog signal.

30. The apparatus of claim 29, wherein:
the DAC is configured to generate the first analog signal based on a first sampling clock;
the first RZ DAC is configured to generate the second analog signal based on a second sampling clock, the second sampling clock having the same frequency and having a phase shift of 180° as compared to the first sampling clock;
the second RZ DAC is configured to generate the third analog signal based on a third sampling clock having a 25% duty cycle, the third sampling clock having the same frequency and having a phase shift of 90° as compared to the first sampling clock; and
the third RZ DAC is configured to generate the fourth analog signal based on a fourth sampling clock having a 25% duty cycle, the fourth sampling clock having the same frequency and having a phase shift of 270° as compared to the first sampling clock.

* * * * *